United States Patent [19]
Jan et al.

[11] Patent Number: 5,491,480
[45] Date of Patent: Feb. 13, 1996

[54] VARIABLE LENGTH DECODER USING SERIAL AND PARALLEL PROCESSING

[75] Inventors: Yung-Jung Jan, Taipei Hsien; Yi-Feng Jang, Keelung, both of Taiwan

[73] Assignee: Industrial Technology Research Institute, Hsinchu, Taiwan

[21] Appl. No.: 249,119

[22] Filed: May 25, 1994

[51] Int. Cl.⁶ .................................................. H08M 7/40
[52] U.S. Cl. .................................................. 341/67; 341/65
[58] Field of Search .................................... 341/65, 67, 63

[56] References Cited

U.S. PATENT DOCUMENTS

| | | | |
|---|---|---|---|
| 4,700,175 | 10/1987 | Bledsoe | 341/65 |
| 4,853,696 | 8/1989 | Mukherjee | 341/65 |
| 5,181,031 | 1/1993 | Tong et al. | 341/65 |
| 5,225,832 | 7/1993 | Wang et al. | 341/67 |
| 5,248,356 | 6/1995 | Ozaki | 341/67 |
| 5,363,097 | 11/1994 | Jan | 341/67 |

OTHER PUBLICATIONS

A. Mukherjee, N. Ranganathan & M. Bassiouni, "Efficient VLSI Designs for Data Transformation or Tree–Based Codes" IEEE Trans. on Cirs. & Sys., vol. 88, No. 3, pp. 306–314 (1991).

Primary Examiner—Marc S. Hoff
Attorney, Agent, or Firm—Meltzer, Lippe, Goldstein et al.

[57] ABSTRACT

The present invention is a variable length decoder architecture. A bit-serial variable length decoder (VLD) receives the coded bit stream directly without buffering. The bit serial VLD determines the end of every variable length code word but does not actually decode the code words. The variable length code words are then buffered and decoded by a plurality of VLD's arranged in parallel. High throughout is achieved with a small amount of buffer capacity.

10 Claims, 4 Drawing Sheets

VARIABLE LENGTH DECODER USING SERIAL AND PARALLEL PROCESSING

FIELD OF THE INVENTION

The present invention relates to a variable length decoder (VLD). More particularly, the present invention relates to a variable length decoder architecture which will meet the high speed requirements of digital High Definition Television (HDTV) and which can be implemented on a single integrated circuit together with a run-length decoder (RLD).

BACKGROUND OF THE INVENTION

An HDTV signal may be coded by first obtaining the Discrete Cosine Transform (DCT) of a block of pixels such as an 8×8 block of pixels. The DCT coefficients may then be zigzag scanned, run-length coded and then variable length coded using, for example, a Huffman code. A decoder for an HDTV signal coded in this manner includes a variable length decoder (VLD) a run-length decoder (RLD), and a processor applying the inverse DCT.

In the HDTV decoder, inputted to the VLD are the variable length code words and outputted from the VLD are fixed length code words which contain two pieces of information: a run length of zeroes and the amplitude of a non-zero DCT coefficient. The run-length decoder receives the fixed length code words. After receiving an input code word, if the run length is not zero, the run length decoder will take (run length+1) clock cycles to output the corresponding run of zeroes followed by a non-zero DCT coefficient. Preferably, the run length decoder has an input with a burst rate of 70 MHz and an output which is synchronous to the system clock at a smooth rate of, for example, 70 MHz, which is typical for an HDTV system. The circuit for obtaining the inverse DCT receives the DCT coefficients from a block of pixels and reconstructs the pixel block.

One example of a variable length code is the Huffman code. The operation of the Huffman code may be understood in connection with FIG. 1. In particular, FIG. 1 illustrates a Huffman tree.

The tree is constructed for a set of seven characters A, B, C, D, E, F and G with the corresponding probabilities of occurrence of these characters being 0.1, 0.1, 0.1, 0.3, 0.1, 0.1 and 0.2 respectively. These probabilities are written in circles corresponding to the leaf nodes of FIG. 1. A circle denoting an internal node in the tree of FIG. 1 contains the sum of the probabilities of its child nodes.

The Huffman code word for a character is the sequence of 0's and 1's in the unique path from the root of the tree to the leaf node representing the character. For example, the code word for A is 000 and the code word for D is 01. To compress the character string DAF, a Huffman encoder concatenates the code words for the three characters to produce the binary string 01000100.

In general, in a Huffman code, characters with a higher probability of occurrence have shorter code words and characters with a lower probability of occurrence have longer code words.

A variable length decoder may be a parallel variable length decoder or a serial variable length decoder. A parallel variable length decoder decodes one variable length word per cycle. A serial variable length decoder decodes one bit per cycle from a bit stream of variable length code words.

A decoder architecture including a parallel variable length decoder and a run-length decoder is illustrated in FIG. 2. In the decoder architecture 100 of FIG. 2, a bit stream comprised of variable length code words (e.g. an HDTV bit stream) is received at a main buffer 120. The variable length code words are then decoded into fixed length code words by the parallel variable length decoder (VLD) 140. A run-length decoder (RLD) 180 then converts each fixed length code word variable length decoder into a run of zeros followed by a non-zero value, which is a DCT coefficient in the case of an HDTV bit stream.

As indicated above, the output of the run-length decoder is synchronous to the system clock with a smooth output rate which is typical for an HDTV system such as 70 MHz. After receiving an input code word whose run length is different from zero, the run-length decoder takes (run-length+1) cycles to output the corresponding run of zeroes followed by a non-zero DCT coefficient. In the meantime, the run decoder 180 outputs a STOP signal on line 150 to suspend the parallel VLD 140 until the last zero has been output. However, when the run length is equal to zero, it means that there are successive non-zero coefficients. In this case, the STOP signal on line 150 will not be activated and the parallel VLD 140 has to operate at the burst input rate of the RLD 180 which for example may be 70 MHz. On the other hand, because there are a lot of zero DCT coefficients in a typical coded HDTV bit stream, the average rate of the parallel VLD 140 is only on the order of 5 MHz.

One type of parallel variable length decoder was proposed by J. W. Peake in "Decompaction", IBM Technical disclosure Bulletin, Vol. 26, No. 9, pp. 4794–4797, February, 1984. A block diagram of this variable length decoder is illustrated in FIG. 3.

The decoder 10 of FIG. 3 includes an input buffer 14 for storing incoming compressed data 12. The input buffer 14 comprises two latches L1 and L2. The number of bit positions in each of the two latches is equal to the longest code word utilized in the system (e.g. P bits) so the two latches together have a total number of bit positions equal to twice the longest codeword in the system (e.g. 2 P bits).

The decoder 10 of FIG. 2 also includes a barrel shifter 16. The barrel shift defines a window of length P in the two latches, which window has a variable location. The two latches of the input buffer are filled with incoming compressed data bits. Initially, the barrel shifter 16 defines a window which is coextensive with the first latch of the input of buffer. The P bits outputted by the barrel shifter 16 are applied to a length programmable logic array (PLA) 22 via lines 19. The bits outputted by the barrel shifter 16 are also applied to a decoder PLA 20 via lines 21. The length PLA 22 outputs via lines 23 the length of the first code word to be decoded. The decoder PLA 20 outputs the corresponding decoded character symbol.

The length of the first code word is fed back via lines 23 to the barrel shifter 16. The window defined by the barrel shifter is then shifted a number of positions equal to the length of the first code word. If the first code word contains Q bits, the window defined by the barrel shifter is shifted so that the first Q bits from the first latch L1 are eliminated from the window and the first Q bits from the second latch L2 are included in the window. Thus, after a decode operation, the number of undecoded bits in the window defined by the barrel shifter 16 is always equal to the longest possible code word in the system which is P bits. The next code word is then decoded by applying the present bits in the barrel shifter to both the length PLA 20 and the decode PLA 22. When enough of the compressed data bits have been decoded so that the number of decoded bits equals or exceeds P, the contents of the second latch L2 are moved into the first latch L1 and new data bits are written into the second latch L2. The barrel shifter 16 then defines a window which includes the bits now in the first latch which have not been decoded and enough bits from the second latch so that the window is equal to P bits. Again, the next code word is decoded by applying the present bits in the barrel shifter 16 to both the length PLA 22 and the decoder PLA 20.

A problem with the parallel variable length decoder of FIG. 3 is that it is very difficult to achieve the 70 MHz and higher speeds which may be utilized by HDTV.

The other approach to variable length decoding is bit-serial decoding. An example of a bit-serial decoder is disclosed in U.S. Pat. No. 4,853,696 which issued Aug. 1, 1989 to A. Mukherjee and in A. Mukherjee et al, "Efficient VLSI Designs for Data Transformation of Tree-Based Codes", IEEE Transactions on Circuits and Systems, Vol. 38, No. Mar. 3, 1991, pp. 306–314. This bit serial decoder is also implemented through use of the Huffman tree. For example, to decompose the binary string 01000100, the decoder moves down the tree while processing the binary string from left to right. Thus, the first 0 causes the decoder to branch to the right child of the root. The following 1 causes the decoder to branch to the external node representing the particular character D. The decoding speed of a bit-serial decoder is one bit/cycle. In the case of a bit-serial decoder, the input bit rate is fixed, while the output bit rate is variable.

To implement the bit-serial decoder, a memory such as a ROM or PROM is used. Each node in the tree of FIG. 1 is one addressable location in the memory. Thus, each time a bit is decoded, one location is read from the memory corresponding to one node of the tree until a leaf node is reached. At this point an end of word flag is generated. The next memory address that is accessed then corresponds to the root node in FIG. 1.

A decoder architecture which uses the bit serial VLD is shown in FIG. 4. The architecture 300 of FIG. 4 comprises the bit serial VLD 310. The bit serial VLD 310 receives the variable length coded bit stream directly from a channel decoder (not shown) or a storage medium (not shown). (In contrast, in FIG. 1, the coded bit stream is buffered by the main buffer 120 before being received at the parallel VLD 140). Thus, the bit-serial VLD 310 is synchronous with the bit stream to be decoded. Because the data rate of an HDTV bit stream is only about 20 Mbits/sec, the bit serial VLD 310 is easily realizable in hardware.

The VLD 310 generates fixed length code words which are stored in the buffer 320. The buffer 320 may be formed by a plurality of sub-buffers 330. A plurality of fixed length code words are then converted to runs of zeros followed by a non-zero coefficient by the run length decoders 340.

Illustratively, each RLD 340 has a burst input rate of 12 MHz and a smooth output rate of 12 MHz. Thus, the overall throughput rate can be in excess of 70 MHz despite the fact that the VLD 310 is a low speed element operating at 20 MHz.

The main disadvantage of this architecture is the size of the buffer 330. The size of the buffer 330 is several times the size of the main buffer 120 of FIG. 2 because the data has been expanded by the bit-serial VLD 310 before buffering. This means that the size of the buffer 330 is very large making mass production of an integrated circuit implementing the architecture 300 of FIG. 4 inefficient and expensive.

To achieve higher speed in variable length decoding, parallel processing may be used. In a parallel processing technique, a plurality of VLD's (bit-serial or bit-parallel) are arranged in parallel so that more than one variable length code word can be decoded at a time. However, in order to use this technique, at the encoder-end, a unique code word must be inserted between each segment of one or more viable length code words. A unique code word means a code word that cannot be generated by any combination of the variable length code words. At the decoder, the unique word is utilized to detect the boundary between adjacent segments. Then, several variable length decoders arranged in parallel are utilized to decode several segments at a time.

A variable length decoder architecture 200 using parallel processing is illustrated in FIG. 5. The bit stream to be decoded is received in the main buffer 210. A unique word detector 220 detects the unique code word which separates the segments. The unique word detector may be formed by a string of exclusive-or (XOR) gates which detect the unique word. A switch 230 which operates under the control of the unique word detector 220 sends n consecutive segments to the n sub-buffers 250-1, 250-2, . . . , 250-n. The segments (each comprising one or more variable length code words) are then decoded in parallel by the n (bit-parallel or bit-serial) variable length decoders 260-1, 260-2, . . . , 260-n.

The architecture 200 of FIG. 5 has several disadvantages:

(1) There is a large hardware overhead. If the data compression efficiency is to be maintained, it is necessary to make the segments very large and then insert the unique word between them. However, then a separate relatively large sub-buffer is required for each relatively large segment. Thus, the architecture 200 of FIG. 5 requires both a main input buffer 210 and all of the sub buffers 240-1, . . . , 240-n.

(2) The efficiency of data compression declines because of the insertion of the unique code words.

(3) This decoder architecture can only be used if the encoder inserts the unique code word. If the unique code word is not inserted at the encoder, this kind of decoder cannot be used.

However, the architectures 200 of the FIG. 5 has a significant advantage in that it has a high throughput.

In view of the foregoing, it is an object of the present invention to provide a VLD architecture which improves upon the prior art VLD architectures discussed above. More specifically, it is an object of the present invention to provide a VLD architecture which has the high throughput of parallel processing but does not have the extra hardware required by the conventional parallel processing architecture of FIG. 5. Furthermore, it is an object of the invention to provide a VLD architecture which (1) fits on a single chip along with an RLD, (2) can reach speeds of 70 MHz or more for use in HDTV systems, and (3) utilizes a minimum amount of buffer capacity while achieving the desired speed.

SUMMARY OF THE INVENTION

The present invention is a variable length decoder architecture. In accordance with an illustrative embodiment, a bit-serial VLD receives a variable length coded bit stream directly without buffering. The bit serial VLD determines the end of every variable length code word in the bit stream but does not actually decode the code words. In other words, the bit serial VLD serves to parse the variable length coded bit stream but does not decode the individual variable length code words.

The parsed code words are then placed in a plurality of buffers arranged in parallel. A separate VLD is associated with each buffer for decoding the variable length code words stored in that buffer. Each of the VLD's associated with a buffer may be a bit-serial VLD or a parallel VLD.

The fixed length code word generated by the VLD's associated with each buffer may be interleaved and converted to runs of zeros followed by a non-zero term by a single RLD or there may be an individual RLD associated with each individual VLD.

It should be noted that there is no buffer in front of the bit-serial parsing VLD. The buffers at the output of the bit-serial parsing VLD may be small because the variable length code words are not yet decoded.

Thus, the inventive architecture has a number of significant advantages. First, because the buffer requirements are small, the inventive VLD architecture easily fits on a single chip (with one or more RLD's). In addition, a high speed suitable for use with HDTV systems is achieved.

DETAILED DESCRIPTION OF THE INVENTION

Figure 6:
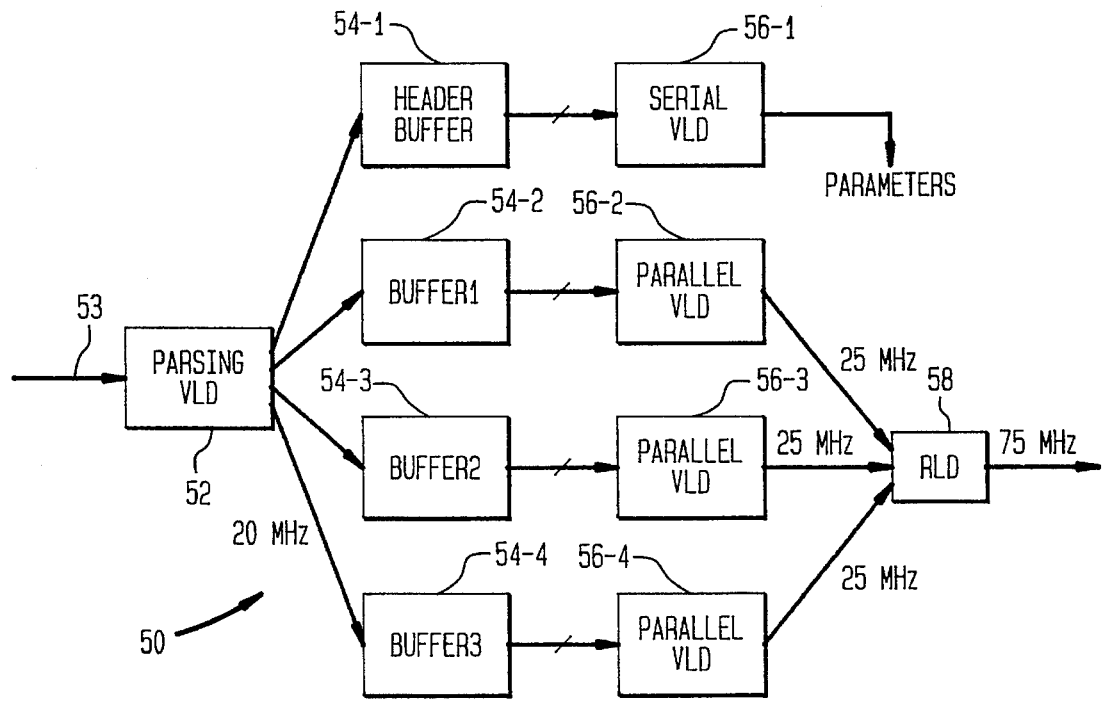
FIG. 6 illustrates a decoder architecture according to an illustrative embodiment of the present invention.

FIG. 6 illustrates a decoder architecture 50 in accordance with one embodiment of the present invention.

The decoder architecture 50 comprises a bit serial VLD 52. The bit serial VLD 12 receives at an input 53 a variable length coded bit stream. This bit stream is received directly from a channel decoder (not shown) or from a storage medium (not shown).

The bit-serial VLD 52 parses the bit stream into individual code words but does not decode the code words.

Figure 4:
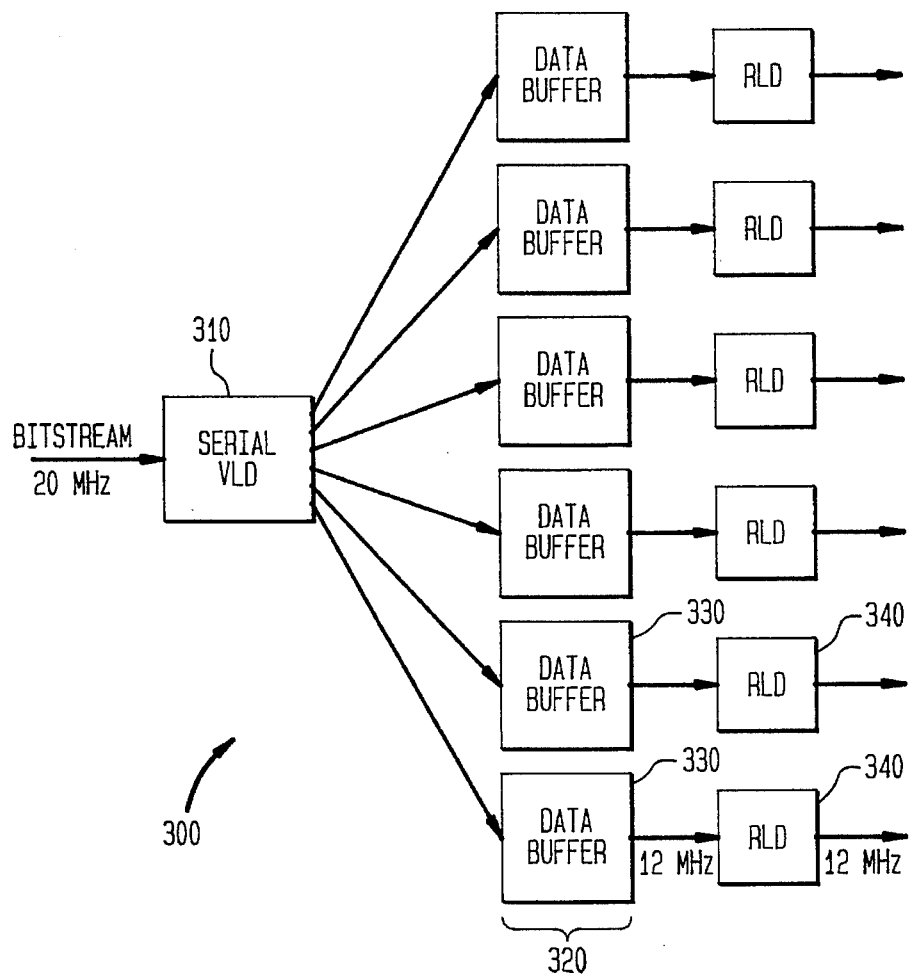
FIG. 4 illustrates a decoder architecture which utilizes a bit-serial VLD.
Figure 5:
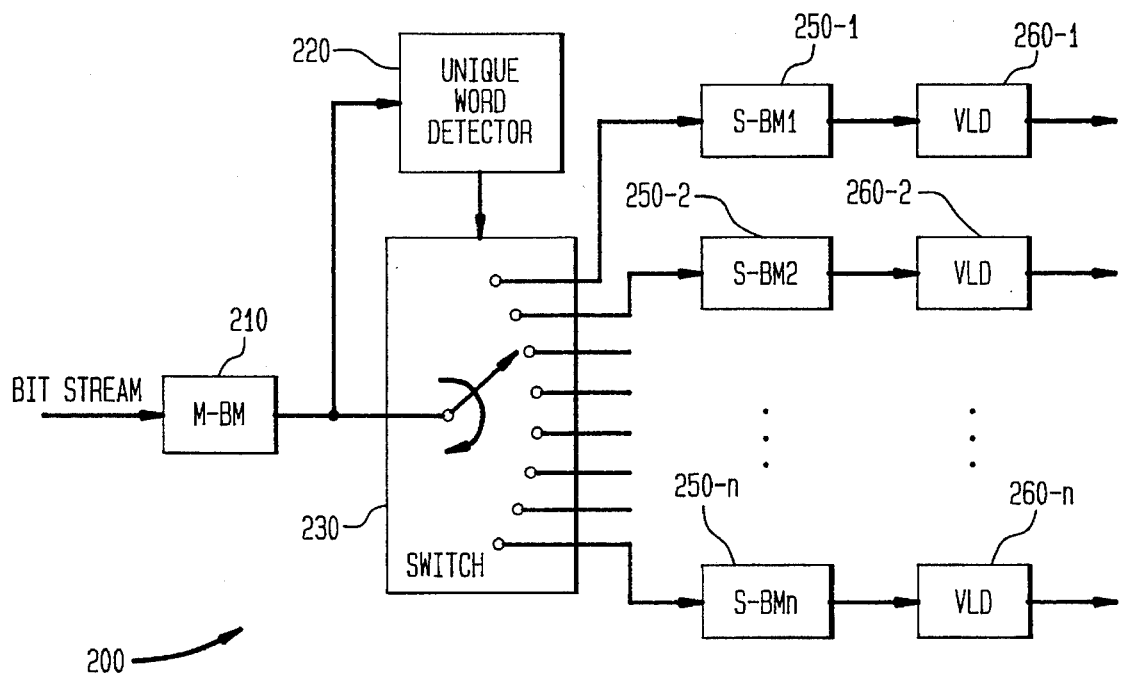
FIG. 5 illustrates a decoder architecture utilizing parallel processing.

More specifically, the bit-serial parsing VLD 52 of FIG. 6 is implemented in the same way as the bit serial VLD 310 described above in connection with FIG. 4. Specifically, a memory stores a coding tree wherein each node corresponds to an address location in memory. The main difference between the VLD 52 of FIG. 6 and the VLD 310 of FIG. 4 is that in the VLD 310 of FIG. 4 each code word which can be decoded is represented by a separate leaf node on the tree and thus by a separate entry in the memory. However, for the parsing VLD 52 of FIG. 6, it is not necessary for each code word to be represented by an individual leaf node because the parsing VLD 52 in fact does no decoding. To the contrary, all that the VLD 52 needs to do is output an end-of-word flag when the end of a word is reached. Thus, a tree with only one leaf node corresponding to one storage location in memory is used by the VLD 52.

Figure 1:
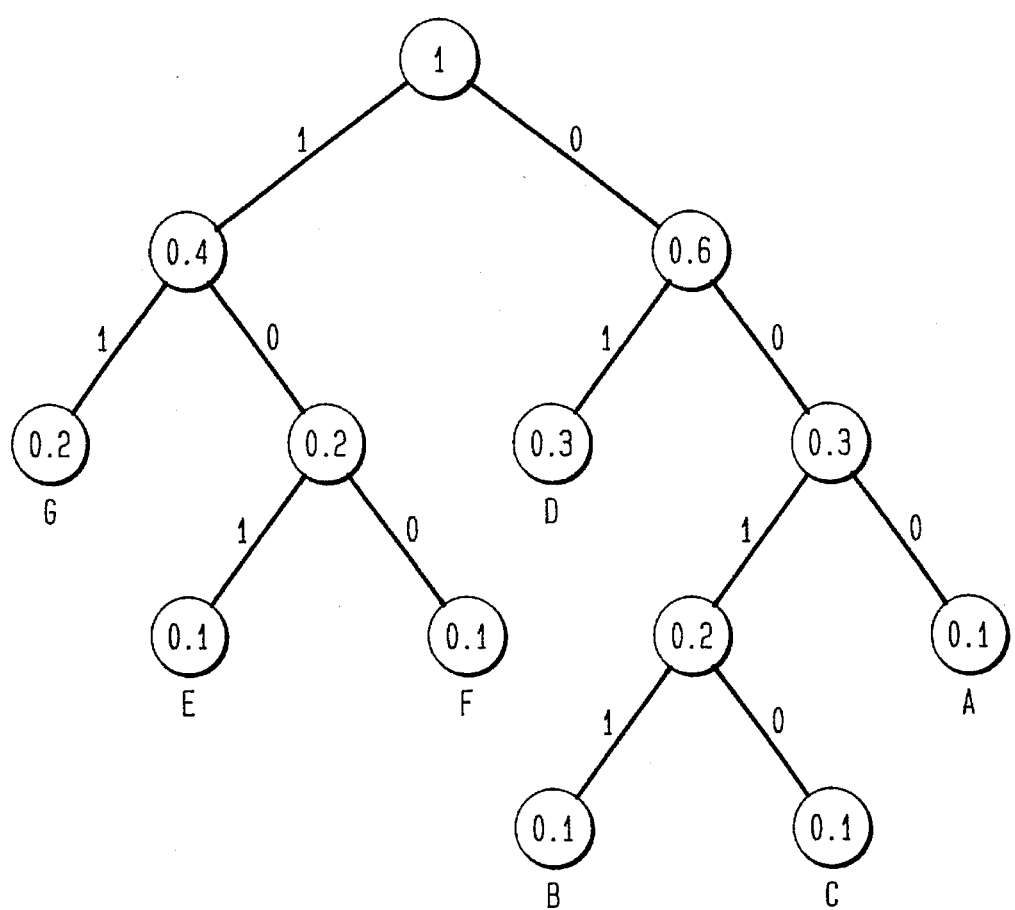
FIG. 1 illustrates a Huffman tree.
Figure 7:
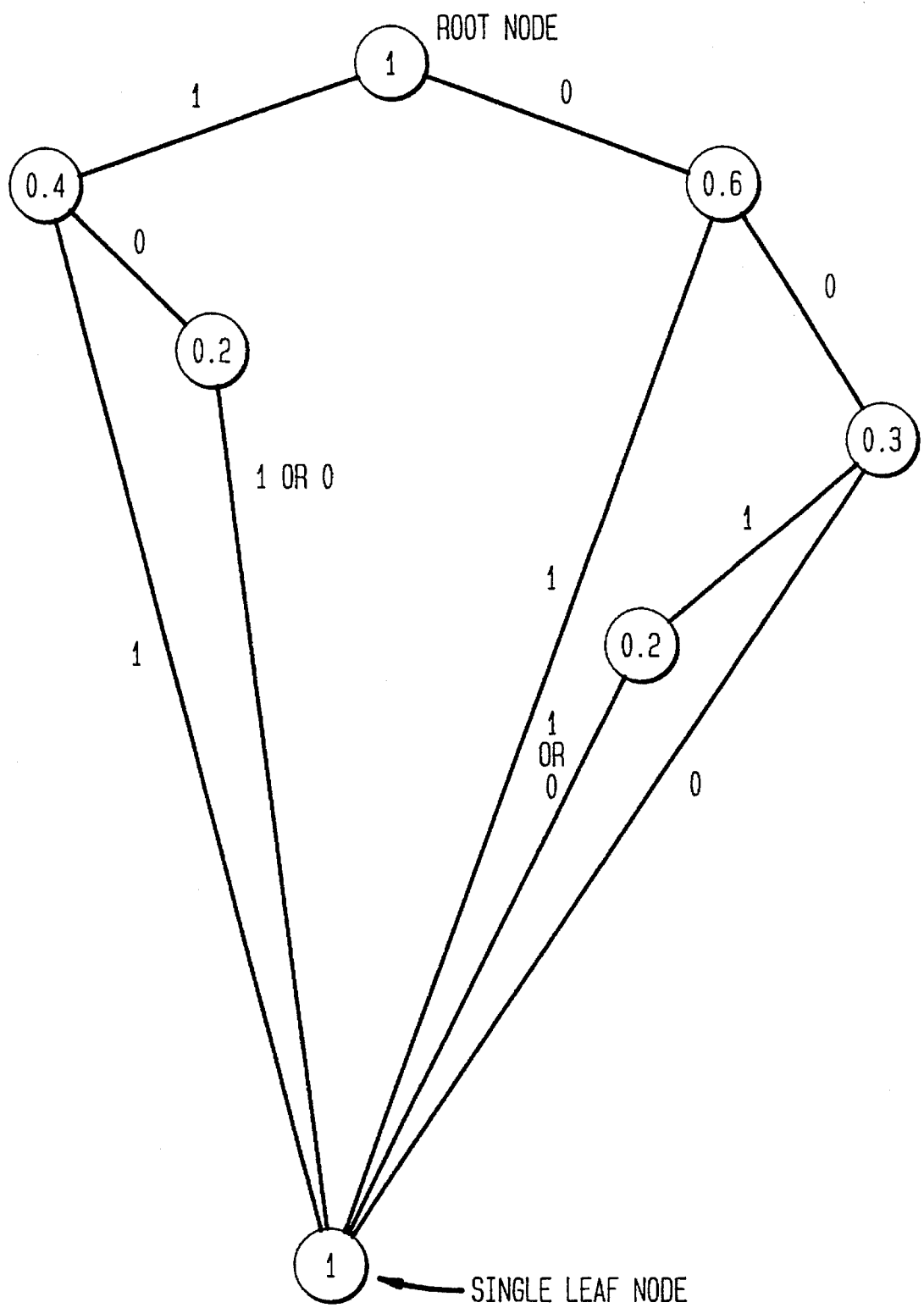
FIG. 7 illustrates a tree which may be used by a bit-serial parsing VLD in the decoder architecture of FIG. 6.

FIG. 7 illustrates how the tree of FIG. 1 is modified so that no decoding takes place but an indication is outputted each time the end of a word is reached. All of the paths in the tree of FIG. 7 end on the same leaf, thus, the tree of FIG. 7 occupies substantially less memory capacity than the tree of FIG. 1. The parsing VLD 52 operates as follows. Starting at the root node, for each bit received, the VLD 52 moves down the tree of FIG. 7 according to whether the bit is a zero or a one until the single leaf node is reached. At this point, an end of word flag is outputted. Decoding then starts again with next bit at the root node.

Figure 2:
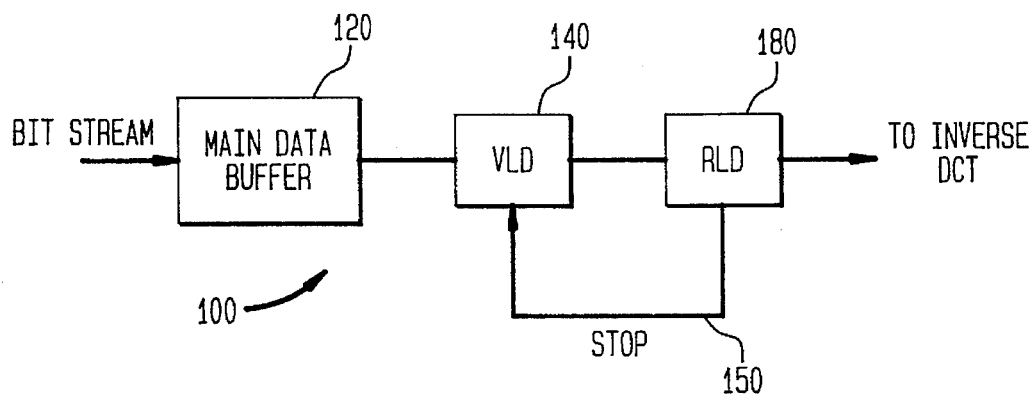
FIG. 2 illustrates a decoder architecture for use in an HDTV system including a parallel VLD and an RLD.
Figure 3:
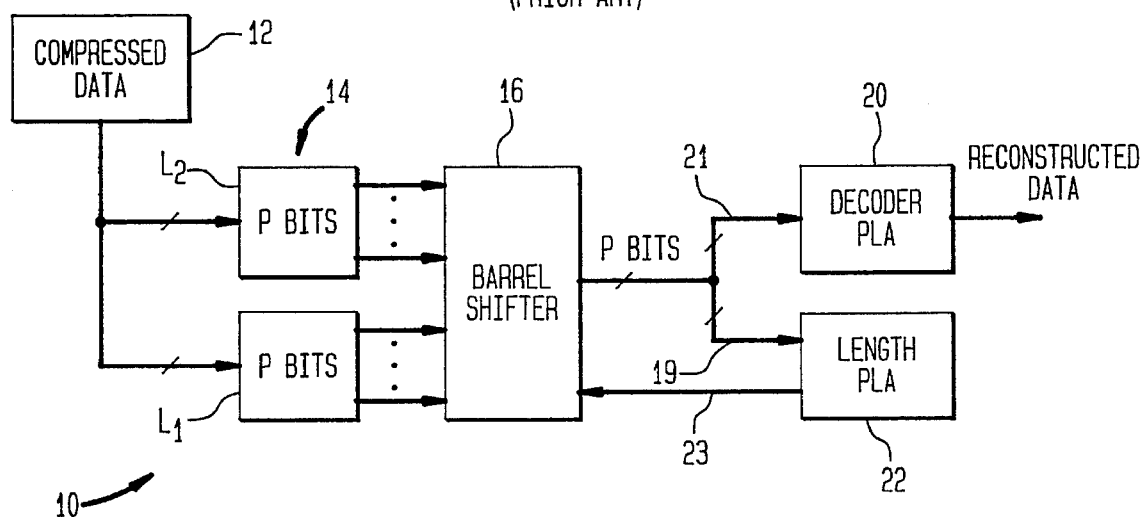
FIG. 3 illustrates a parallel VLD for use in the decoder architecture of FIG. 1.

The parsed variable length code words outputted by the VLD 52 of FIG. 6 are stored in the buffers 54-1, 54-2, 54-3, 54-4. In comparison to the buffer 320 of FIG. 4, the buffers 54 of FIG. 6 require much less capacity because the buffer 320 of FIG. 4 stores decoded fixed length code words, while the buffer 54 stores undecoded variable length code words. In fact, the combined size of the buffers 54 of FIG. 6 is no greater than the size of the main buffer 120 of FIG. 2.

In an illustrative embodiment of the invention, the video bit stream to be decoded comprises macro-blocks. A macro-block is preceded by a header and comprises six 8×8 blocks of pixels, four of the blocks containing luminance pixels and two of the blocks containing chrominance pixels. The fixed length codewords for the header are placed in the buffer 54-1, wherein different headers can have different lengths of codewords. The variable length code words for the pixel blocks are placed in the buffers 54-2, 54-3, 54-4 in an interleaved manner.

Associated with each buffer 54-1, 54-2, 54-3, 54-4 is a corresponding VLD, 56-1, 56-2, 56-3, 56-4. Illustratively the VLD 56-1 is a bit-serial VLD and the VLD's 56-2, 56-3, 56-4 are parallel VLD's. Each of the VLD's 56-1, 56-2, 56-3, 56-4 decodes the variable length words in the associated buffer. In general, the header of the next macro-block is being decoded while the pixel blocks of the present macro-block are being decoded. Thus, there is plenty of time to decode the header and a bit-serial VLD 56-1 can be used for this purpose. The header has parameter which are used for subsequent decoding of the corresponding pixel blocks, e.g. identification of VLD tables to be used by VLD decoders, 56-2, 56-3, 56-4, quantization step size used at the encoder, etc.

It should be noted that no buffer is required at the output of the VLD's 56 because the output of the VLD's 56-2, 56-3, 56-14 are word interleaved. The fixed length words outputted by the VLD's 56-2, 56-13, 56-4 (corresponding to the pixel blocks of each macroblock, for example) are transmitted to an RLD 58 for further decoding (e.g. conversion of each fixed length word into a run of zeros followed by a non-zero DCT coefficient).

To achieve a 70 MHz–80 MHz bit rate for use in an HDTV system, it is desirable for the parsing bit-serial VLD 52 to operate at 20–25 MHz and the parallel VLD's 56-2, 56-3, 56-4 to operate at about 25 MHz. The serial VLD 56-1 may operate at a rate up to 40 MHz.

In short, a unique variable length decoder architecture has been disclosed. The unique decoder architecture utilizes both bit-serial and parallel processing. The architecture is especially useful for decoding variable bit length encoded digital video.

Finally, the above described embodiments of the invention are intended to be illustrative only. Numerous alternative embodiments may be devised by those skilled in the art without departing from the spirit and scope of the following claims.

We claim:

1. A decoder architecture comprising a bit-serial variable length decoder for receiving a variable length coded bit stream and for parsing said bit stream into individual variable length code words, buffer means for buffering the individual variable length code words, and a plurality of variable length decoders for decoding a plurality of said variable length code words in parallel to generate fixed length code words.

2. The decoder architecture of claim 1 wherein said bit stream is a digital video bit stream.

3. The decoder architecture of claim 1 wherein said buffer means comprises a plurality of buffers arranged in parallel, each of said plurality of variable length decoders being associated with one of said buffers.

4. The decoder architecture of claim 1 wherein at least one of said variable length decoders in said plurality is a bit-serial variable length decoder.

5. The decoder architecture of claim 1 wherein at least one of said variable length decoders in said plurality is a parallel variable length decoder.

6. The decoder architecture of claim 1 further comprising run-length decoding means for decoding said fixed length code words.

7. A decoder architecture comprising a bit-serial variable length decoder for receiving a variable length coded bit stream and for parsing said bit stream into individual variable length code words without decoding said variable length code words, and a plurality of variable length decoders arranged in parallel for decoding said variable length code words.

8. The decoder architecture of claim 7 further comprising buffer means connected between said bit-serial variable length decoder and said plurality of variable length decoders.

9. A method for decoding a variable length coded bit stream comprising the steps of using a bit-serial variable length decoder, parsing the bit stream into individual variable length code words, and using a plurality of variable length decoders arranged in parallel, decoding said variable length code words.

10. The method of claim 9 wherein said step of parsing the bit stream comprises for each bit in the bit stream accessing a memory storing a variable length code tree having a single leaf node and for generating an end of word flag when the single leaf node in said tree is reached.

* * * * *